(12) United States Patent
Lin et al.

(10) Patent No.: US 6,436,791 B1
(45) Date of Patent: Aug. 20, 2002

(54) METHOD OF MANUFACTURING A VERY DEEP STI (SHALLOW TRENCH ISOLATION)

(75) Inventors: Shih-Chi Lin, Taipei; Szu-An Wu, Hsin-Chu; Ying-Lang Wang, Tai-Chung County; Guey-Bao Huang, Tungshan, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/880,259

(22) Filed: Jun. 14, 2001

(51) Int. Cl.[7] ............................................. H01L 21/302
(52) U.S. Cl. ..................... 438/424; 438/692; 438/694; 438/700; 438/704; 438/723; 438/724; 438/719; 438/756; 438/757; 438/751; 438/736
(58) Field of Search ................................ 438/692, 694, 438/700, 704, 723, 724, 719, 756, 757, 751, 736, 424, 435, 425, 427, 430, 433

(56) References Cited

U.S. PATENT DOCUMENTS

| | | | |
|---|---|---|---|
| 4,256,514 A | 3/1981 | Pogge | 148/1.5 |
| 4,471,525 A | 9/1984 | Sasaki | 29/576 W |
| 4,528,047 A | 7/1985 | Beyer et al. | 148/175 |
| 4,847,214 A | 7/1989 | Robb et al. | 437/67 |
| 4,942,137 A | 7/1990 | Sivan et al. | 437/63 |
| 5,387,538 A | 2/1995 | Moslehi | 437/67 |
| 5,700,712 A | 12/1997 | Schwalke | 437/62 |
| 5,930,646 A | 7/1999 | Gerung et al. | 438/431 |
| 6,306,723 B1 * | 10/2001 | Chen et al. | 438/429 |

* cited by examiner

Primary Examiner—George Goudreau
(74) Attorney, Agent, or Firm—George O. Saile; Stephen B. Ackerman; Stephen G. Stanton

(57) ABSTRACT

A method of forming a shallow trench isolation structure comprising the following steps. A substrate having an upper surface is provided. A pad oxide layer is formed upon the substrate. A nitride layer is formed over the pad oxide layer. The nitride layer having an upper surface. A trench is formed by etching the nitride layer, pad oxide layer and a portion of the substrate. The trench having a bottom and side walls. An oxide film is deposited upon the etched nitride layer surface, and the bottom and side walls of trench. The oxide film is removed from over the etched nitride layer surface, and the bottom of the trench to expose a portion of substrate within the trench. The removal of oxide film leaving oxide spacers over the trench side walls. Epitaxial silicon is selectively deposited over the exposed portion of substrate, filling the trench. A thermal oxide layer is formed over the epitaxial silicon, annealing the interface between the epitaxial silicon and the oxide spacers. The etched nitride layer and the oxide layer from over the etched substrate; and a portion of the oxide spacers extending above the surface of the etched substrate are removed, whereby the shallow trench isolation structure is formed within the trench.

25 Claims, 2 Drawing Sheets

METHOD OF MANUFACTURING A VERY DEEP STI (SHALLOW TRENCH ISOLATION)

FIELD OF THE INVENTION

The present invention relates generally to semiconductor fabrication and more specifically to fabricating STIs (shallow trench isolation structures).

BACKGROUND OF THE INVENTION

The current deep shallow trench isolation (STI) methods are difficult.

U.S. Pat. No. 5,700,712 to Schwalke et al. describes a method for producing an insulating trench in a silicon-on-insulator (SOI) substrate having integrated logic elements and high-voltage power components. A trench extending down to an insulating layer is etched and covered with a doped silicon structure. Diffusion regions proximate the trench are formed by drive-out from the doped amorphous silicon structure and an insulation structure is simultaneously produced in the trench by oxidation of the doped silicon structure.

U.S. Pat. No. 5,387,538 to Moslehi describes a method for forming semiconductor device isolation structure.

U.S. Pat. No. 4,471,525 to Sasaki describes a method for manufacturing a semiconductor device utilizing a two-step etch and selective oxidation to form isolation regions.

U.S. Pat. No. 4,942,137 to Sivan et al. describes a method for fabricating a self-aligned trench structure in a semiconductor device.

U.S. Pat. No. 5,930,646 to Gerung et al. describes a process for forming isolations of uniform thickness in narrow and wide trenches.

U.S. Pat. No. 4,847,214 to Robb et al. describes a method for filling trenches from a seed layer.

U.S. Pat. No. 4,256,514 to Pogge describes a method for forming a narrow dimensioned, e.g. submicron, region on a silicon body.

U.S. Pat. No. 4,528,047 to Beyer et al. describes a method for forming a void free isolation structure utilizing etch and fill techniques.

SUMMARY OF THE INVENTION

Accordingly, it is an object of the present invention to provide an improved method of forming a deep shallow trench isolation structure.

Other objects will appear hereinafter.

It has now been discovered that the above and other objects of the present invention may be accomplished in the following manner. Specifically, a substrate having an upper surface is provided. A pad oxide layer is formed upon the substrate. A nitride layer is formed over the pad oxide layer. The nitride layer having an upper surface. A trench is formed by etching the nitride layer, pad oxide layer and a portion of the substrate. The trench having a bottom and side walls. An oxide film is deposited upon the etched nitride layer surface, and the bottom and side walls of trench. The oxide film is removed from over the etched nitride layer surface, and the bottom of the trench to expose a portion of substrate within the trench. The removal of oxide film leaving oxide spacers over the trench side walls. Epitaxial silicon is selectively deposited over the exposed portion of substrate, filling the trench. A thermal oxide layer is formed over the epitaxial silicon, annealing the interface between the epitaxial silicon and the oxide spacers. The etched nitride layer and the oxide layer from over the etched substrate; and a portion of the oxide spacers extending above the surface of the etched substrate are removed, whereby the shallow trench isolation structure is formed within the trench.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
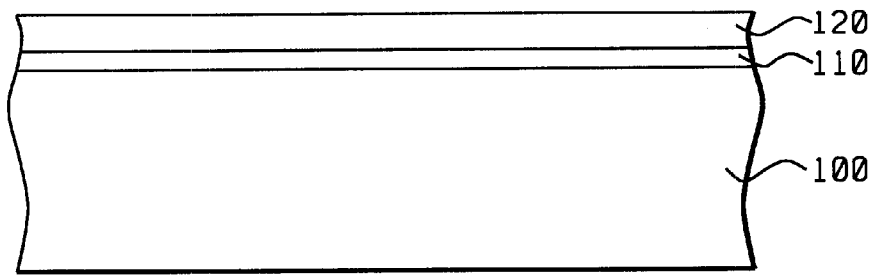
FIGS. 1 to 6 schematically illustrate a preferred embodiment of the present invention.

As shown in FIG. 1, substrate 100 may be a semiconductor substrate and has a pad oxide layer 110 grown thereover to a thickness of preferably from about 100 to 200 Å. Silicon nitride (nitride) layer 120 is formed over pad oxide 110 to a thickness of preferably from about 1000 to 1600 Å. Substrate 100 is preferably comprised of native silicon or epitaxial silicon (epi).

Etch Wide Area Trench 125

Figure 2:
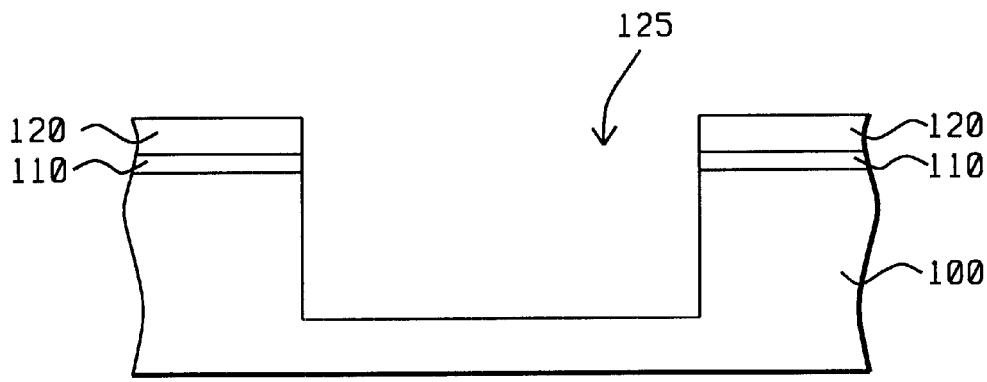

As shown in FIG. 2, a dry etch is performed to form wide area trench 125 through nitride layer 120 and pad oxide 110, and into substrate 100. The dry etch may be conducted, for example, by first forming a patterned mask layer (not shown), such as a patterned photoresist layer, over nitride layer 120. The actual width of trench 125 depends upon the design requirement.

Deposit Silicon Oxide Film 130

Figure 3:
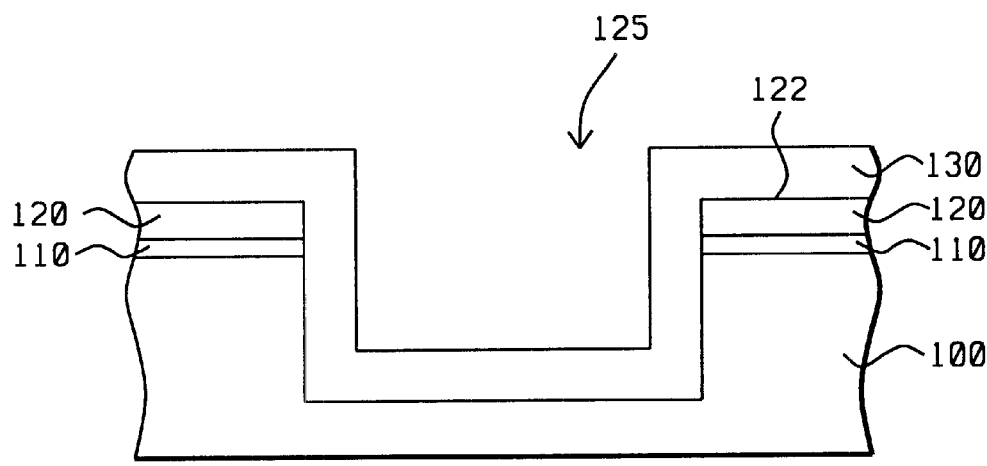

As shown in FIG. 3, film 130 is formed over the structure of FIG. 2 lining wide area trench 125 and the upper surface 122 of nitride layer 120. Film 130 is preferably comprised of silicon oxide (oxide) and is more preferably comprised of oxide formed by a chemical vapor deposition (CVD) method.

Oxide film 130 has a thickness of preferably from about 2000 to 3500 Å depending upon the design.

Dry Etch to Expose Substrate 100

Figure 4:
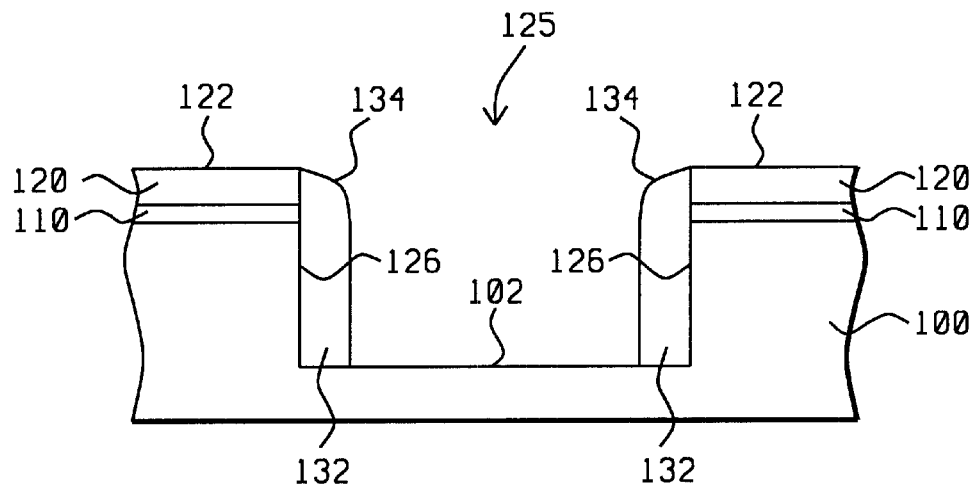

As shown in FIG. 4, oxide film 130 is subjected to a dry etch that exposes portion 102 of substrate 100 and removes the portion of oxide film 130 from the upper surface 122 of nitride layer 120, forming oxide spacers 132 over the side walls 126 of trench 125 that may have rounded upper corners 134. The oxide film dry etch is preferably a reactive ion etch (RIE).

Deposit Selective Epitaxial Silicon 140

Figure 5:
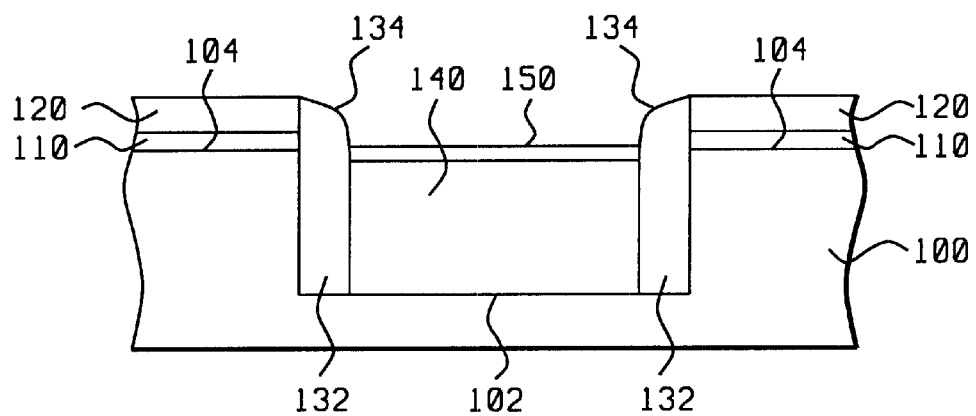

As shown in FIG. 5, selective epitaxial silicon 140 is deposited within oxide spacer 132 lined wide area trench 125 over the exposed portion 102 of substrate 100. Epitaxial silicon 140 is preferably formed so that it is at least even with the upper surface 104 of etched substrate 100.

Thermal oxide layer 150 is then grown over epitaxial silicon 140 to a thickness of from about 200 to 300 Å and more preferably about 200 Å. Thermal oxide layer 150 is formed to anneal the interface between epitaxial silicon 140 and the sidewall oxide (oxide spacers 132) and to protect the epitaxial silicon 140 during the following nitride and oxide removal step.

Removal of Etched Nitride Layer 120, Pad Oxide 110 and Thermal Oxide Layer 150

Figure 6:
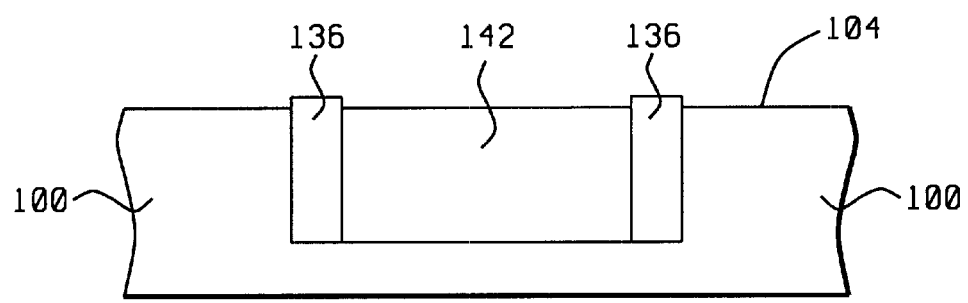

As shown in FIG. 6, etched nitride layer 120, etched pad oxide layer 110 and thermal oxide layer 150 are removed, preferably by either: two wet etch processes; or a wet etch and a chemical mechanical polishing (CMP) process. For example, hot phosphoric acid may be used to remove etched nitride layer 120 and hydrofluoric acid (HF) may be used to remove thermal oxide layer 150.

This completes formation of very deep STI structures 136, that is STI structures 136 have a high aspect ratio (height:width). Oxide posts/STI structures 136 serve to isolate epitaxial silicon 142 from substrate 100 and the upper surface 104 of substrate 100.

Advantages of the Present Invention

The advantages of one or more embodiments of the present invention include:

1. the formation of thermal oxide layer 150 protects selectively deposited epitaxial silicon 140 during the removal of etched nitride layer 120; and
2. the formation of thermal oxide layer 150 improves the oxide/epitaxial interface.

While particular embodiments of the present invention have been illustrated and described, it is not intended to limit the invention, except as defined by the following claims.

We claim:

1. A method of forming a shallow trench isolation structure, comprising the steps of:
   providing a substrate having an upper surface;
   forming a pad oxide layer upon the substrate;
   forming a nitride layer over the pad oxide layer; the nitride layer having an upper surface;
   forming a trench by etching the nitride layer, pad oxide layer and a portion of the substrate; the trench having a bottom and side walls;
   depositing an oxide film upon the etched nitride layer surface, and the bottom and side walls of the trench;
   removing the oxide film from over the etched nitride layer surface, and the bottom of the trench to expose a portion of substrate within the trench; the removal of oxide film leaving oxide spacers over the trench side walls;
   selectively depositing epitaxial silicon over the exposed portion of substrate, completely filling the trench up to the upper surface of the substrate;
   forming a thermal oxide layer over the epitaxial silicon, annealing the interface between the epitaxial silicon and the oxide spacers; and
   removing the etched nitride layer and the pad oxide layer from over the etched substrate, the thermal oxide layer from over the epitaxial silicon and a portion of the oxide spacers extending above the surface of the etched substrate.

2. The method of claim 1, wherein the thermal oxide layer has a thickness of from about 200 to 300 Å.

3. The method of claim 1, wherein the pad oxide layer has a thickness of from about 100 to 200 Å; the nitride layer has a thickness of from about 1000 to 1600 Å; and the oxide film has a thickness of from about 2000 to 3500 Å.

4. The method of claim 1, wherein the pad oxide layer has a thickness of from about 100 to 200 Å; the nitride layer has a thickness of from about 1000 to 1600 Å; the thermal oxide layer has a thickness of from about 200 to 300 Å; and the oxide film has a thickness of from about 2000 to 3500 Å.

5. The method of claim 1, wherein two wet etch processes are used to remove:
   the etched nitride layer and the pad oxide layer from over the etched substrate; and
   the thermal oxide layer from over the epitaxial silicon.

6. The method of claim 1, wherein a wet etch and a CMP process are used to remove:
   the etched nitride layer and the pad oxide layer from over the etched substrate; and
   the thermal oxide layer from over the epitaxial silicon.

7. The method of claim 1, wherein the trench is formed by a dry etch.

8. The method of claim 1, wherein the removal of the oxide film from over the etched nitride layer surface and the bottom of the trench is performed by an RIE dry etch.

9. A method of forming a shallow trench isolation structure, comprising the steps of:
   providing a substrate having an upper surface;
   forming a pad oxide layer upon the substrate;
   forming a nitride layer over the pad oxide layer; the nitride layer having an upper surface;
   forming a trench by dry etching the nitride layer, pad oxide layer and a portion of the substrate; the trench having a bottom and side walls;
   depositing an oxide film upon the etched nitride layer surface, and the bottom and side walls of trench;
   performing an RIE dry etch to remove the oxide film from over the etched nitride layer surface, and the bottom of the trench to expose a portion of substrate within the trench; the removal of oxide film leaving oxide spacers over the trench side walls;
   selectively depositing epitaxial silicon over the exposed portion of substrate, completely filling the trench up to the upper surface of the substrate;
   forming a thermal oxide layer over the epitaxial silicon, annealing the interface between the epitaxial silicon and the oxide spacers; and
   removing the etched nitride layer and the pad oxide layer from over the etched substrate; the thermal oxide layer from over the epitaxial silicon and a portion of the oxide spacers extending above the surface of the etched substrate.

10. The method of claim 9, wherein the thermal oxide layer has a thickness of from about 200 to 300 Å.

11. The method of claim 9, wherein the pad oxide layer has a thickness of from about 100 to 200 Å; the nitride layer has a thickness of from about 1000 to 1600 Å; and the oxide film has a thickness of from about 2000 to 3500 Å.

12. The method of claim 9, wherein the pad oxide layer has a thickness of from about 100 to 200 Å; the nitride layer has a thickness of from about 1000 to 1600 Å; the thermal oxide layer has a thickness of from about 200 to 300 Å; and the oxide film has a thickness of from about 2000 to 3500 Å.

13. The method of claim 9, wherein two wet etch processes are used to remove:
   the etched nitride layer and the pad oxide layer from over the etched substrate; and
   the thermal oxide layer from over the epitaxial silicon.

14. The method of claim 9, wherein a wet etch and a CMP process are used to remove:
   the etched nitride layer and the pad oxide layer from over the etched substrate; and
   the thermal oxide layer from over the epitaxial silicon.

15. A method of forming a shallow trench isolation structure, comprising the steps of:
   providing a substrate having an upper surface;
   forming a pad oxide layer upon the substrate;
   forming a nitride layer over the pad oxide layer; the nitride layer having an upper surface;
   forming a trench by etching the nitride layer, pad oxide layer and a portion of the substrate; the trench having a bottom and side walls;
   depositing an oxide film upon the etched nitride layer surface, and the bottom and side walls of the trench;
   removing the oxide film from over the etched nitride layer surface, and the bottom of the trench to expose a portion of substrate within the trench; the removal of oxide film leaving oxide spacers over the trench side walls;
   selectively depositing epitaxial silicon over the exposed portion of substrate, completely filling the trench up to the upper surface of the substrate;
   forming a thermal oxide layer over the epitaxial silicon, annealing the interface between the epitaxial silicon and the oxide spacers; the thermal oxide layer has a thickness of from about 200 to 300 Å; and
   removing the etched nitride layer and the pad oxide layer from over the etched substrate, the thermal oxide layer from over the epitaxial silicon and a portion of the oxide spacers extending above the surface of the etched substrate.

16. The method of claim 15, wherein the pad oxide layer has a thickness of from about 100 to 200 Å; the nitride layer has a thickness of from about 1000 to 1600 Å; and the oxide film has a thickness of from about 2000 to 3500 Å.

17. The method of claim 15, wherein two wet etch processes are used to remove:
   the etched nitride layer and the pad oxide layer from over the etched substrate; and
   the thermal oxide layer from over the epitaxial silicon.

18. The method of claim 15, wherein a wet etch and a CMP process are used to remove:
   the etched nitride layer and the pad oxide layer from over the etched substrate; and
   the thermal oxide layer from over the epitaxial silicon.

19. The method of claim 15, wherein the trench is formed by a dry etch.

20. The method of claim 15, wherein the removal of the oxide film from over the etched nitride layer surface and the bottom of the trench is performed by an RIE dry etch.

21. A method of forming a shallow trench isolation structure, comprising the steps of:
   providing a substrate having an upper surface;
   forming a pad oxide layer upon the substrate;
   forming a nitride layer over the pad oxide layer; the nitride layer having an upper surface;
   forming a trench by dry etching the nitride layer, pad oxide layer and a portion of the substrate; the trench having a bottom and side walls;
   depositing an oxide film upon the etched nitride layer surface, and the bottom and side walls of the trench;
   removing the oxide film from over the etched nitride layer surface, and the bottom of the trench to expose a portion of substrate within the trench; the removal of oxide film leaving oxide spacers over the trench side walls;
   selectively depositing epitaxial silicon over the exposed portion of substrate, completely filling the trench up to the upper surface of the substrate;
   forming a thermal oxide layer over the epitaxial silicon, annealing the interface between the epitaxial silicon and the oxide spacers; the thermal oxide layer has a thickness of from about 200 to 300 Å; and
   removing the etched nitride layer and the pad oxide layer from over the etched substrate, the thermal oxide layer from over the epitaxial silicon and a portion of the oxide spacers extending above the surface of the etched substrate.

22. The method of claim 21, wherein the pad oxide layer has a thickness of from about 100 to 200 Å; the nitride layer has a thickness of from about 1000 to 1600 Å; and the oxide film has a thickness of from about 2000 to 3500 Å.

23. The method of claim 21, wherein two wet etch processes are used to remove:
   the etched nitride layer and the pad oxide layer from over the etched substrate; and
   the thermal oxide layer from over the epitaxial silicon.

24. The method of claim 21, wherein a wet etch and a CMP process are used to remove:
   the etched nitride layer and the pad oxide layer from over the etched substrate; and
   the thermal oxide layer from over the epitaxial silicon.

25. The method of claim 21, wherein the removal of the oxide film from over the etched nitride layer surface and the bottom of the trench is performed by an RIE dry etch.

* * * * *